(12) United States Patent
Khor et al.

(10) Patent No.: US 12,550,723 B2
(45) Date of Patent: Feb. 10, 2026

(54) STRUCTURE FOR CAPACITOR HAVING DEFECT-PREVENTING REGIONS IN METAL ELECTRODE

(71) Applicant: GlobalFoundries Singapore Pte. Ltd., Singapore (SG)

(72) Inventors: EeJan Khor, Singapore (SG); Ramasamy Chockalingam, Singapore (SG); Juan Boon Tan, Singapore (SG); Pannirselvam Somasuntharam, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 669 days.

(21) Appl. No.: 17/816,493

(22) Filed: Aug. 1, 2022

(65) Prior Publication Data
US 2024/0038653 A1  Feb. 1, 2024

(51) Int. Cl.
*H01L 23/522* (2006.01)
*H10D 1/68* (2025.01)

(52) U.S. Cl.
CPC ......... *H01L 23/5223* (2013.01); *H10D 1/692* (2025.01)

(58) Field of Classification Search
CPC .......... H10D 1/60–716; H01L 23/5223; H01L 23/642
See application file for complete search history.

(56) References Cited

U.S. PATENT DOCUMENTS

| 7,943,476 | B2 | 5/2011 | Bang |
| 9,368,392 | B2 | 6/2016 | Tseng et al. |
| 10,580,581 | B2 | 3/2020 | Fox, III et al. |
| 11,031,457 | B2 | 6/2021 | Li et al. |
| 2002/0058391 | A1 | 5/2002 | Kim et al. |
| 2009/0096062 | A1* | 4/2009 | Bang ................... H01L 23/5223 257/532 |
| 2011/0049589 | A1* | 3/2011 | Chuang .................. H10F 39/18 257/292 |
| 2022/0384564 | A1* | 12/2022 | Chen ..................... H01G 4/005 |

* cited by examiner

*Primary Examiner* — Suberr L Chi
(74) *Attorney, Agent, or Firm* — Francois Pagette; Hoffman Warnick LLC

(57) ABSTRACT

A structure for a capacitor is provided. The structure includes a first metal electrode, such as a copper electrode, having at least one dielectric region, such as a dielectric, therein. A first dielectric layer is on the first metal electrode, and a second metal electrode is on the first dielectric layer. At least one via is on the second metal electrode. Each via is over the at least one dielectric region in the first metal electrode.

19 Claims, 7 Drawing Sheets

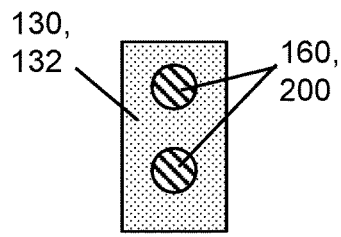 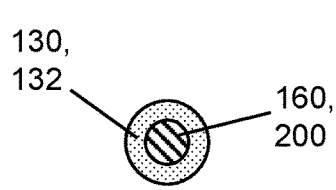 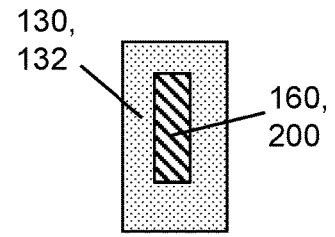
FIG. 8  FIG. 9  FIG. 10
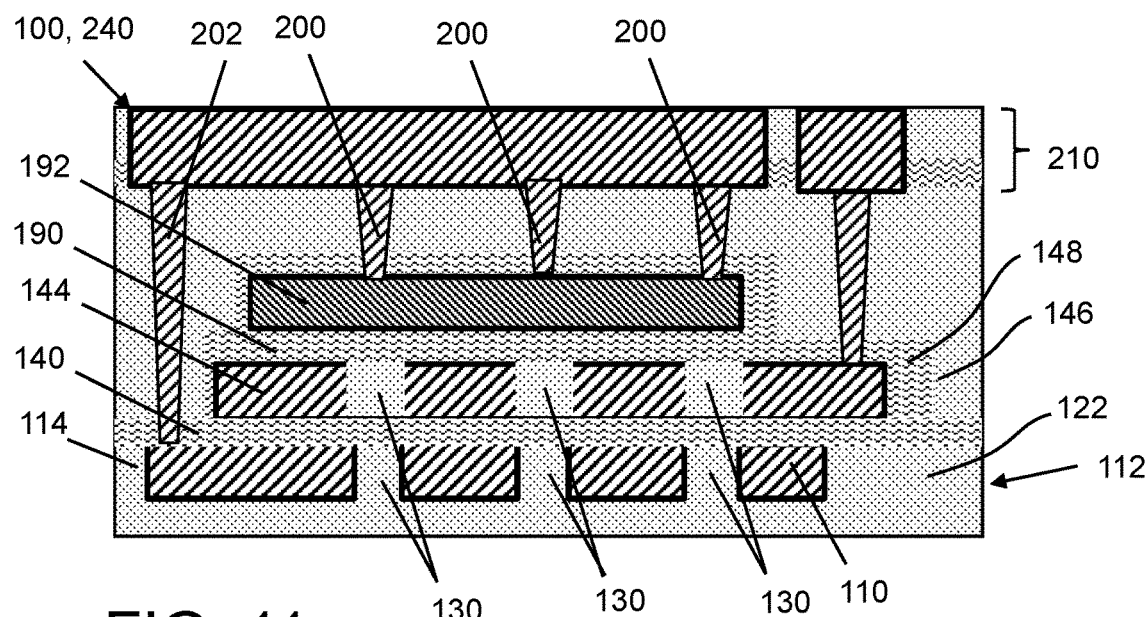
FIG. 11

US 12,550,723 B2

STRUCTURE FOR CAPACITOR HAVING DEFECT-PREVENTING REGIONS IN METAL ELECTRODE

BACKGROUND

The present disclosure relates to integrated circuit structures and, more particularly, to a capacitor structure including a metal electrode having dielectric, defect-preventing regions therein for positioning under vias to another electrode over the metal electrode.

Capacitors are used in a wide variety of integrated circuits (ICs). As ICs have scaled smaller, forming capacitors has become more challenging. For example, where a lower electrode of the capacitor is formed of a metal prone to nanoscale defects, such as hillocks (bumps) in a surface of a copper electrode, the defects can transfer to layers over the lower, metal electrode and create weakened areas therein. The defects are difficult to detect during fabrication. Vias to another electrode over the lower, metal electrode can break through the electrode where the defects exist during fabrication or later, during use of the device. The break throughs can cause shorts and impact performance of the device, such as decreasing the break down voltage.

SUMMARY

All aspects, examples and features mentioned below can be combined in any technically possible way.

An aspect of the disclosure provides a structure comprising: a first metal electrode; at least one dielectric region in the first metal electrode; a first dielectric layer on the first metal electrode; a second metal electrode on the first dielectric layer; and at least one via on the second metal electrode, each of the at least one via is over the at least one dielectric region in the first metal electrode.

Another aspect of the disclosure includes any of the preceding aspects, and the first metal electrode includes copper (Cu).

Another aspect of the disclosure includes any of the preceding aspects, and each of the at least one dielectric region includes an oxide.

Another aspect of the disclosure includes any of the preceding aspects, and each via is vertically aligned over the at least one dielectric region in the first metal electrode.

Another aspect of the disclosure includes any of the preceding aspects, and further comprising a second dielectric layer on the second metal electrode and a third metal electrode on the second dielectric layer.

Another aspect of the disclosure includes any of the preceding aspects, and the first metal electrode includes copper (Cu), and the second metal electrode and the third metal electrode include tantalum (Ta).

Another aspect of the disclosure includes any of the preceding aspects, and the first dielectric layer and the second dielectric layer include a nitride.

Another aspect of the disclosure includes any of the preceding aspects, and the at least one dielectric region has a horizontal cross-sectional size sufficient to be under more than one of the at least one via.

Another aspect of the disclosure includes any of the preceding aspects, and the first metal electrode is positioned in a last metal layer of an integrated circuit chip.

Another aspect of the disclosure includes any of the preceding aspects, and the second metal electrode includes a plurality of digitated elements over the first dielectric layer, the at least one via landing on at least one of the plurality of digitated elements.

An aspect of the disclosure includes a capacitor structure, comprising: a copper electrode; at least one oxide region in the copper electrode; a first dielectric layer on the copper electrode; a first metal electrode on the first dielectric layer; and at least one via on the first metal electrode, each of the at least one via is over the at least one oxide region in the copper electrode.

Another aspect of the disclosure includes any of the preceding aspects, and each via is vertically aligned over the at least one oxide region in the copper electrode.

Another aspect of the disclosure includes any of the preceding aspects, and further comprising a second dielectric layer on the first metal electrode and a second metal electrode on the second dielectric layer.

Another aspect of the disclosure includes any of the preceding aspects, and the first metal electrode and the second metal electrode include tantalum (Ta).

Another aspect of the disclosure includes any of the preceding aspects, and the at least one oxide region has a horizontal cross-sectional size sufficient to be under more than one of the at least one via.

Another aspect of the disclosure includes any of the preceding aspects, and the copper electrode is positioned in a last metal layer of an integrated circuit chip.

An aspect of the disclosure relates to a method comprising: forming a copper electrode over a substrate, the copper electrode having a plurality of dielectric regions interspersed therewithin; forming a first dielectric layer on the copper electrode; forming a first metal electrode on the first dielectric layer; and forming at least one via on the first metal electrode, each of the at least one via in a location is over a respective dielectric region in the copper electrode.

Another aspect of the disclosure includes any of the preceding aspects, and forming the copper electrode includes: forming an opening in a dielectric layer, the opening including the plurality of dielectric regions therein; forming copper in the opening and about the plurality of dielectric regions; and planarizing to form the copper electrode.

Another aspect of the disclosure includes any of the preceding aspects, and at least one of the plurality of dielectric regions has a horizontal cross-sectional size sufficient to be under more than one of the at least one vias.

Another aspect of the disclosure includes any of the preceding aspects, and the plurality of dielectric regions include an oxide, and the first metal electrode and the second metal electrode include tantalum (Ta).

Two or more aspects described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein:

FIG. 8 shows a top-down schematic view of vias over a dielectric region, according to other embodiments of the disclosure.

FIG. 9 shows a top-down schematic view of a via over a dielectric region, according to yet other embodiments of the disclosure.

FIG. 10 shows a top-down schematic view of a via over a dielectric region, according to additional embodiments of the disclosure.

FIG. 11 shows a cross-sectional view of a structure, according to alternative embodiments of the disclosure.

Figure 1A:
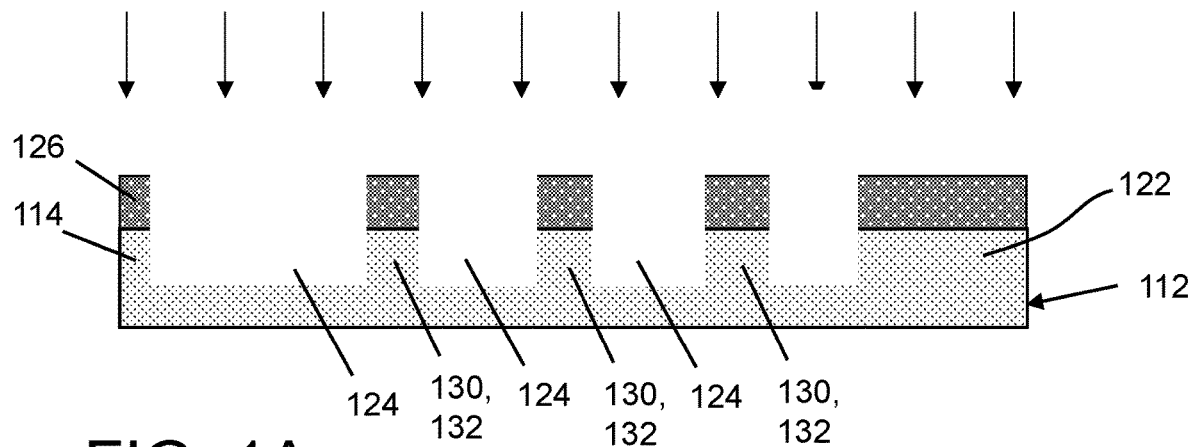
FIG. 1A shows a cross-sectional view of forming part of a first metal electrode, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure for a capacitor that includes a first metal electrode, such as a copper electrode, having at least one dielectric region therein. A first dielectric layer is on the first metal electrode, and a second metal electrode is on the first dielectric layer. At least one via is on the second metal electrode. Each via is over the at least one dielectric region in the first metal electrode. The structure prevents any nano-scale defects in the first metal electrode, such as copper hillocks or similar defects, from transferring to layers thereover in a manner that can result in defects such as via break-through of metal electrode(s) and dielectric layer(s) over the first metal electrode. The structure can be applied to a capacitor regardless of the number of metal electrodes therein. The structure results in less defects and better performance for capacitor structures, e.g., increased breakdown voltage.

Turning to the drawings, a method of forming a structure 100 (FIGS. 4A-B, 6, 11) according to embodiments of the disclosure is illustrated. As will be described herein, structure 100 (FIGS. 4A-B, 6, 11) may find application as a capacitor structure such as a metal-insulator-metal (MIM) capacitor, e.g., single MIM or triple MIM capacitor.

Figure 1B:
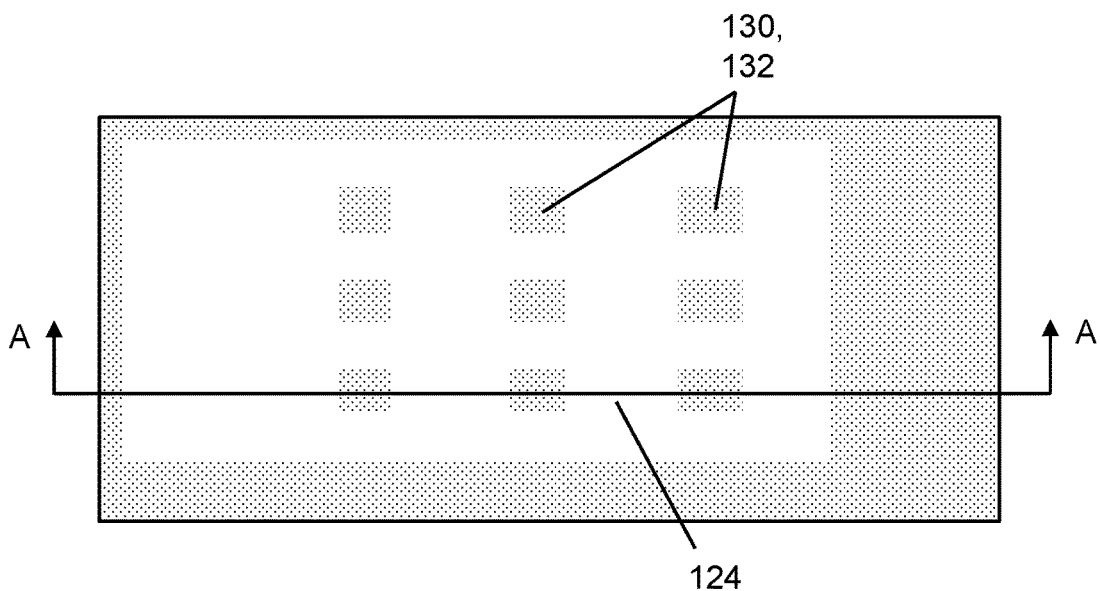
FIG. 1B shows a top-down view of forming part of a first metal electrode, according to embodiments of the disclosure.
Figure 2A:
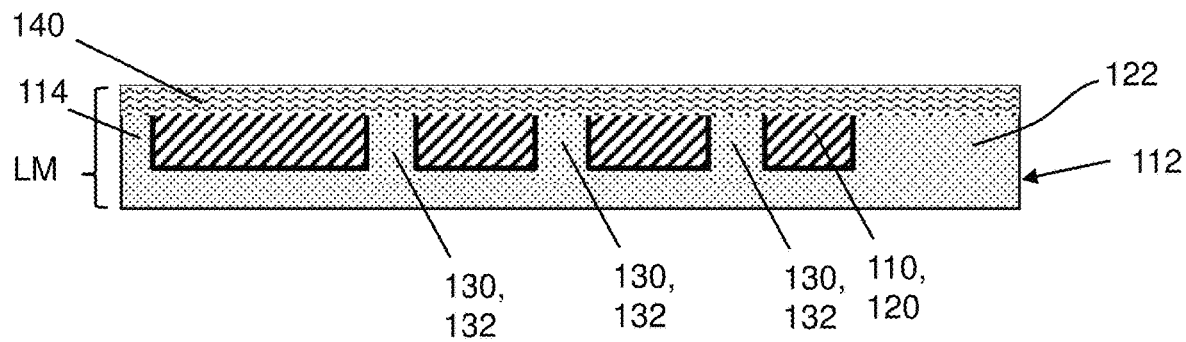
FIG. 2A shows a cross-sectional view of forming a first metal electrode having dielectric regions therein, according to embodiments of the disclosure.
Figure 2B:
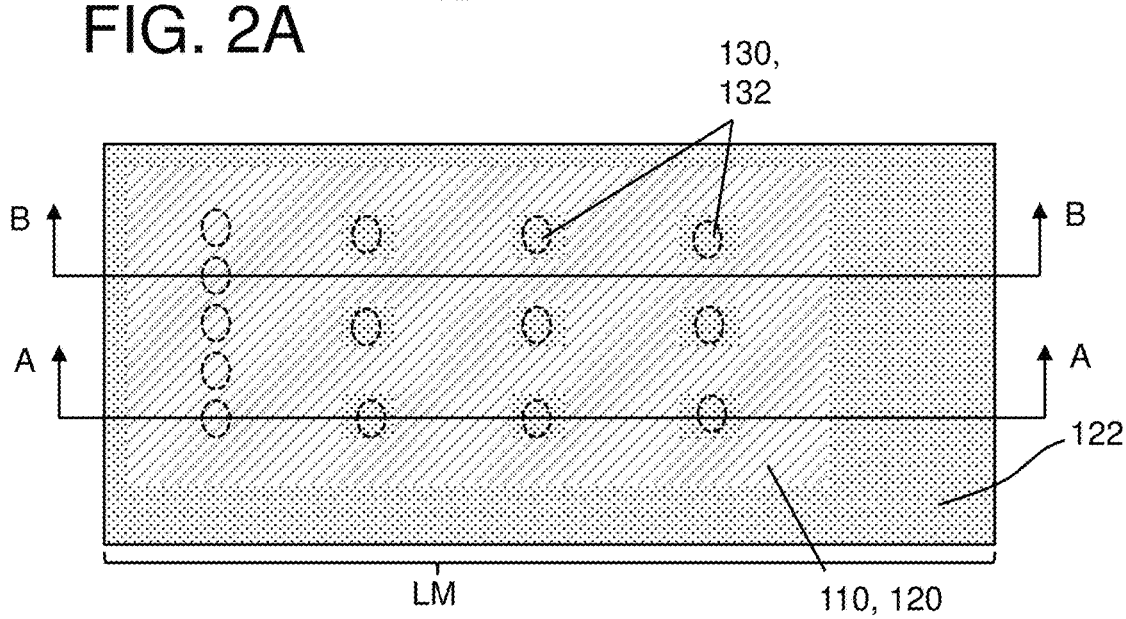
FIG. 2B shows a top-down view of forming part of a first metal electrode having dielectric regions therein, according to embodiments of the disclosure.

FIGS. 1A-2B show various views of forming a first metal electrode 110 (FIGS. 2A-B) over a substrate 112. Substrate 112 may include a metal layer 114 of any now known or later developed integrated circuit (IC) structure. In certain embodiments, first metal electrode 110 (FIGS. 2A-B) may be in a last metal layer (LM) of an IC chip. However, structure 100 (FIGS. 4A-B and 6) may be located in any layer(s) of an IC structure such as but not limited to any middle-of-line (MOL) and/or back-end-of-line (BEOL) interconnect layer. First metal electrode 110 (FIGS. 2A-B) may include any metal prone to nano-scale defects that affect later formed layers. For certain embodiments, first metal electrode 110 (FIGS. 2A-B) may include a copper (Cu) electrode. Formation of copper is known to form nano-scale defects such as hillocks, i.e., small bumps on a surface of the layer, which can transfer to layers thereover and cause narrowing and/or curvature in the layers. The transferred defects can lead to other defects such as via break-through of electrodes or dielectric layers over first metal electrode 110 (FIGS. 2A-B). It is noted that the teachings of the disclosure may be applied to any metal used for capacitor electrodes, e.g., aluminum, which may present nano-scale defects in a surface thereof.

First metal electrode 110 may be formed in a number of ways. FIG. 1A shows a cross-sectional view and FIG. 1B shows a top-down view of forming part of first metal electrode 110 (FIGS. 2A-B). FIG. 1A shows a cross-section through view line A-A in FIG. 1B. As shown in FIGS. 1A-B, in certain embodiments, an opening 124 is formed in a layer 122. While opening 124 is shown in FIG. 1B as a single opening, it will be recognized that opening 124 may include more than one opening, if desired, with interconnections in other layers to electrically couple the parts of first metal electrode 110 (FIGS. 2A-B) formed in openings 124 together. In certain embodiments, layer 122 may include any now known or later developed inter-layer dielectric (ILD) such as but not limited to silicon oxide, silicate glass (SG), silicon oxycarbide, or fluorine doped silicon oxide. In other embodiments, layer 122 may include any material that would function within a conductor of an integrated circuit (e.g., of copper), but would be free of nano-scale defects such as those described herein. Opening(s) 124 may be formed using any now known or later developed technique such as forming a mask 126, patterning mask 126, and etching to form opening(s) 124 in layer 122. Mask 126 may include any appropriate mask material, e.g., a silicon nitride hard mask or a photoresist. The etching may include any appropriate chemistry for layer 122, e.g., a reactive ion etch (RIE) for silicon oxide. Mask 126 may be removed using any known removal process appropriate for the mask material, e.g., a wet etch for hard nitride mask or an ashing process (oxygen dry strip process) for a soft resist-based mask. As shown in FIGS. 1A-B, where layer 122 includes a dielectric, opening(s) 124 form layer 122 into at least one dielectric region 130. Thus, opening 124 includes at least one dielectric region 130 or, as shown, a plurality of dielectric regions 130, therein. More particularly, opening(s) 124 create dielectric region(s) 130 located to correspond to a location in which at least one via will be formed to a metal electrode over first metal electrode 110 (FIGS. 2A-B). Dielectric region(s) 130 may include pillars 132 of dielectric material within opening(s) 124. As noted, in certain embodiments, dielectric region(s) 130 may include any now known or later developed inter-layer dielectric material such as but not limited to silicon oxide, i.e., creating oxide regions.

FIG. 2A shows a cross-sectional view and FIG. 2B shows a top-down view of forming first metal electrode 110. FIG. 2A shows a cross-section through view line A-A in FIG. 2B. (Note, FIG. 2B omits dielectric layer 140 in FIG. 2A for clarity and shows the eventual location of vias 160 (FIGS. 4A-B) with dashed line circles). FIGS. 2A-B show a metal layer 120, e.g., copper, may be formed by depositing the metal in opening(s) 124 and about dielectric region(s) 130. The metal, e.g., copper, may be deposited using any appropriate deposition technique such as but not limited to atomic layer deposition (ALD), chemical vapor deposition (CVD), or plasma-enhanced (PECVD). In this manner, metal layer 120 (copper) is formed in opening(s) 124 and about dielectric region(s) 130. Metal layer 120 may be planarized after deposition to, e.g., remove any excess materials, forming first metal electrode 110. The planarization may include any appropriate technique such as chemical mechanical polishing (CMP). First metal electrode 110 is illustrated in the form of a planar metal plate but could have other shapes and/or configurations. Dielectric region(s) 130 remain in first metal electrode 110 after the latter's formation. Dielectric region(s) 130 can be interspersed in first metal electrode 110 in a manner to ensure any vias formed to a later-formed electrode over first metal electrode 110 are over one of dielectric region(s) 130. As will be further described, opening(s) 124 (FIGS. 1A-B) and dielectric region(s) 130 may be shaped to accommodate any size and/or shape of vias formed thereover.

FIG. 2A also shows forming a first dielectric layer 140 on first metal electrode 110 (and dielectric region(s) 130 therein). First dielectric layer 140 may include any now known or later developed dielectric material appropriate for a capacitor dielectric. In certain embodiments, first dielectric layer 140 may include silicon nitride. In other embodiments, first dielectric layer 140 may include but is not limited to: silicon oxynitride, high-k material having a relative permittivity above about 10, or any combination of the aforementioned materials. Examples of high-k material include but are not limited to metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$, where x, y, and z represent relative proportions, each greater than or equal to zero and $x+y+z=1$ (1 being the total relative mole quantity). First dielectric layer 140 may be formed using any appropriate deposition technique for the material chosen, e.g., ALD or CVD.

Figure 3:
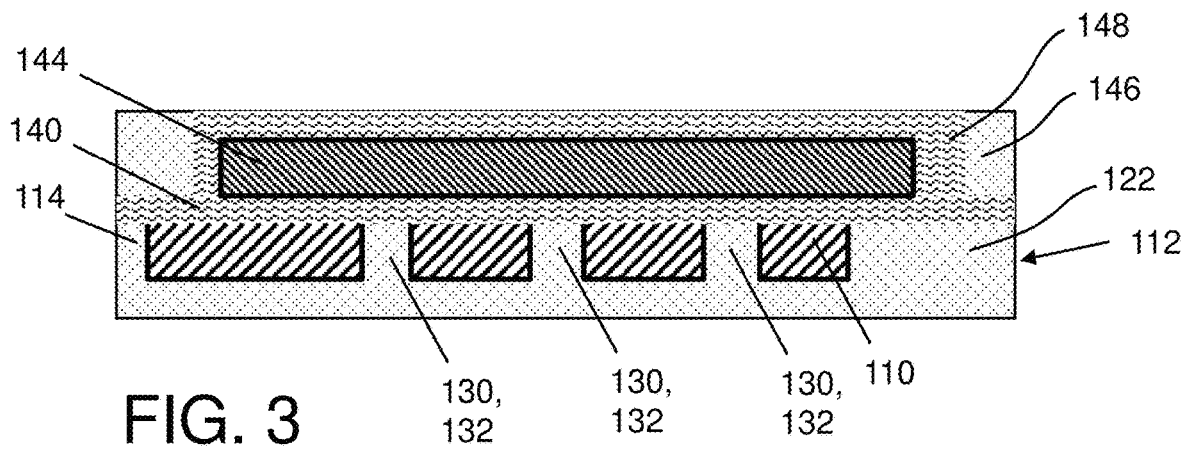
FIG. 3 shows a cross-sectional view of forming a first dielectric layer and a second metal electrode, according to embodiments of the disclosure.

FIG. 3 shows a cross-sectional view of forming a metal electrode 144 on first dielectric layer 140. In certain embodiments, metal electrode 144 may include tantalum. In other embodiments, metal electrode 144 may include any metal appropriate for a non-bottom electrode of a MIM capacitor such as but not limited to tungsten, titanium, ruthenium, cobalt, copper or aluminum. Metal electrode 144 may be formed using any now known or later developed technique. For example, metal electrode 144 may be formed by depositing an ILD 146 over first dielectric layer 140 (or depositing an additional thickness 148 of first dielectric layer 140), forming a mask (not shown), patterning the mask, etching openings in ILD 146 (or extra first dielectric layer 148), depositing the metal of metal electrode 144, and planarizing to remove excess material. The metal, e.g., tantalum, may be deposited using any appropriate deposition technique such as but not limited to ALD, CVD or PECVD. Metal electrode 144 may be sized and shaped in any now known or later developed fashion, e.g., based on the openings formed in ILD 146 or the extra thickness 148 of first dielectric layer 140. Metal electrode 144 is illustrated in the form of a planar metal plate but could have other shapes and/or configurations. Metal electrode 144 may be surrounded by and/or covered by additional thickness 148 of first dielectric layer 140 or ILD 146 in a known fashion.

Figure 4A:
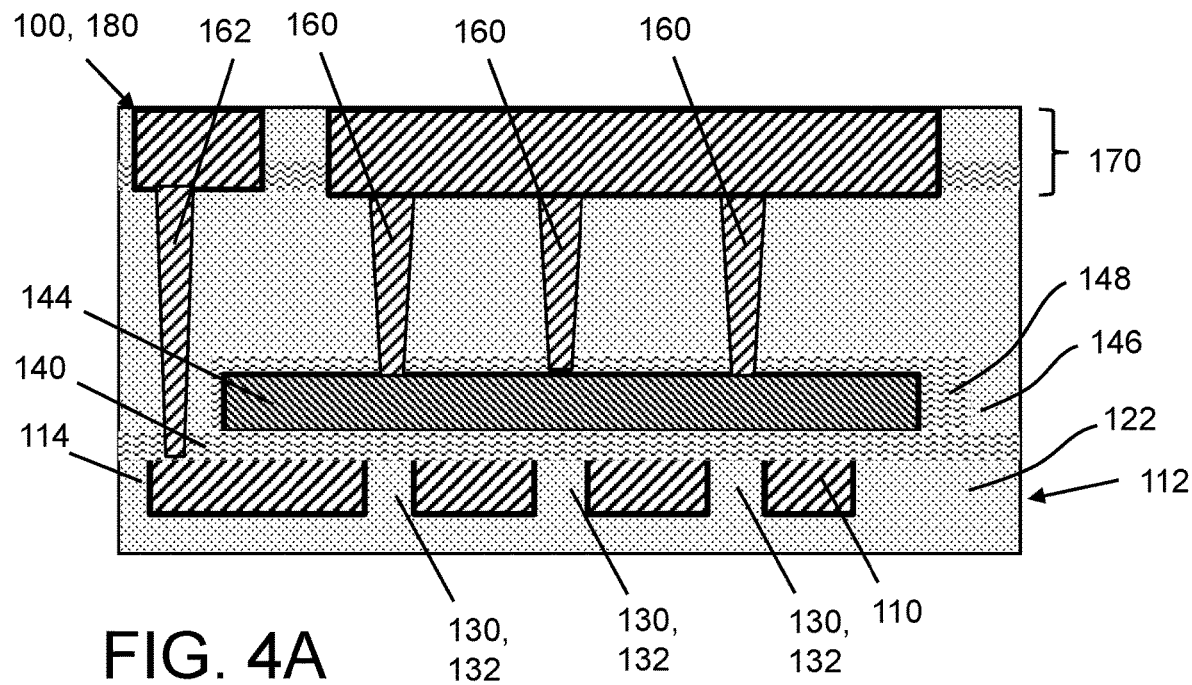
FIG. 4A shows a first cross-sectional view of forming at least one via to the second metal electrode and a structure, according to embodiments of the disclosure.
Figure 4B:
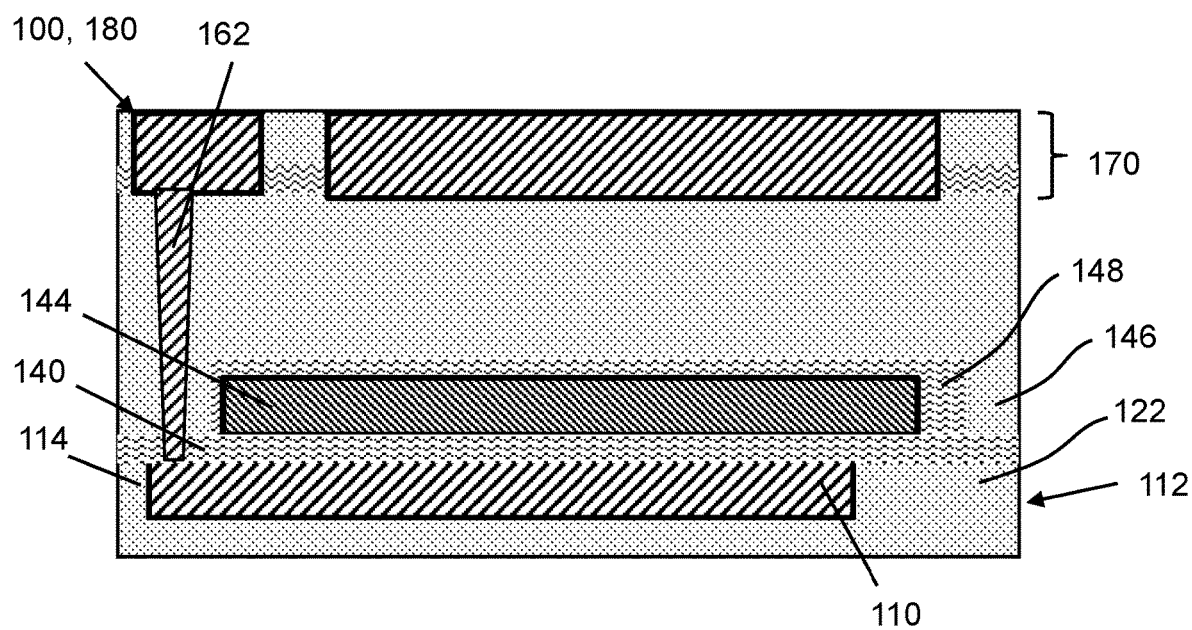
FIG. 4B shows a second cross-sectional view of forming at least one via to the second metal electrode and a structure, according to embodiments of the disclosure.

FIGS. 4A-B show cross-sectional views of forming at least one via 160 on metal electrode 144. FIG. 4A shows a cross-sectional view through dielectric regions 130 (similar to view line A-A in FIG. 2B), and FIG. 4B shows a cross-sectional view through first metal electrode (similar to view line B-B in FIG. 2B). As illustrated, each via 160 on metal electrode 144 is in a location over a respective dielectric region 130, i.e., dielectric pillar 132, in first metal electrode 110. Subsequent or prior thereto, at least one (longer) via 162 may be formed to first metal electrode 110. Vias 160, 162 (also known as contacts) may be formed using any now known or later developed technique. In one non-limiting example, vias 160, 162 may be formed by patterning a respective mask, etching one or more contact openings to the respective electrodes 110, 144 through dielectric layers 140, 146, 148, and forming a conductor in the respective opening(s). The conductor may include refractory metal liner, and a conductive metal. The refractory metal liner (not labeled for clarity) may include, for example, ruthenium (Ru), tantalum (Ta), titanium (Ti), tungsten (W), iridium (Jr), rhodium (Rh) and platinum (Pt), etc., or mixtures of thereof. The conductive metal may include any now known or later developed contact metal such as but not limited to copper (Cu) or tungsten (W). Any required silicidation of electrodes 110, 144 may also be provided in a typical fashion. As shown in FIG. 4A, formation of dielectric region(s) 130, e.g., dielectric pillar(s) 132, in first metal electrode 110 removes any area therein that could cause defects that could impact formation or operation of via(s) 160. For example, dielectric region(s) 130 remove any hillocks on a copper electrode 110 that could narrow first dielectric layer 140 or metal electrode 144, or otherwise cause break-through of via(s) 160 through at least metal electrode 144.

Any number of conventional interconnect layers 170 may be subsequently formed over vias 160, 162. For example, a metal wire interconnect layer 170 may be formed to interconnect selective vias 160, 162. It will be recognized that a wide variety of additional layers can be created.

FIGS. 4A-B also show structure 100 according to embodiments of the disclosure. In these embodiments, structure 100 may take the form of a single MIM capacitor structure 180. Structure 100 includes first metal electrode 110. In certain embodiments, first metal electrode 110 may include copper, but other metals such as aluminum are also possible. Structure 100 also includes at least one dielectric region 130 such as dielectric pillar(s) 132 in first metal electrode 110. Dielectric region(s) 130 may include, for example, oxide. First dielectric layer 140 is on first metal electrode 110 (and dielectric region(s) 130), creating a capacitor dielectric. Structure 100 also includes (second) metal electrode 144 on first dielectric layer 140. Structure 100 also includes at least one via 160 on metal electrode 144. Each via 160 is over a dielectric region 130, e.g., a dielectric pillar 132, in first metal electrode 110. In certain embodiments, each via 160 may be vertically aligned over a dielectric region 130 in first metal electrode 110, but this is not necessary in all cases so long as each via 160 is over a dielectric region 130 (not necessarily aligned).

Figure 5:
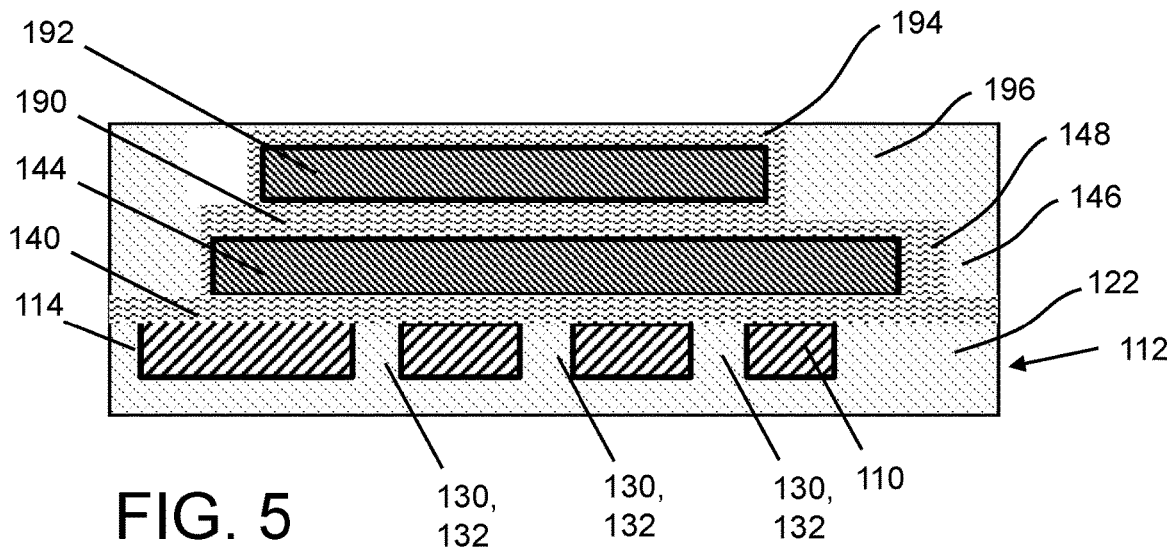
FIG. 5 shows a cross-sectional view of forming a second dielectric layer and a third metal electrode, according to other embodiments of the disclosure.

Returning to FIG. 3 and with reference to the cross-sectional view of FIG. 5, in other embodiments, the method may also include forming a second dielectric layer 190 on second metal electrode 144 and a third metal electrode 192 on second dielectric layer 190. Second dielectric layer 190 may include any of the materials listed herein for first dielectric layer 140 and may be formed in the same manner. Metal electrode 192 may include any of the materials listed herein for metal electrode 144 and may be formed in the same manner. Metal electrode 192 may be surrounded by and/or covered by additional second dielectric layer 194 material or ILD 196.

Figure 6A:
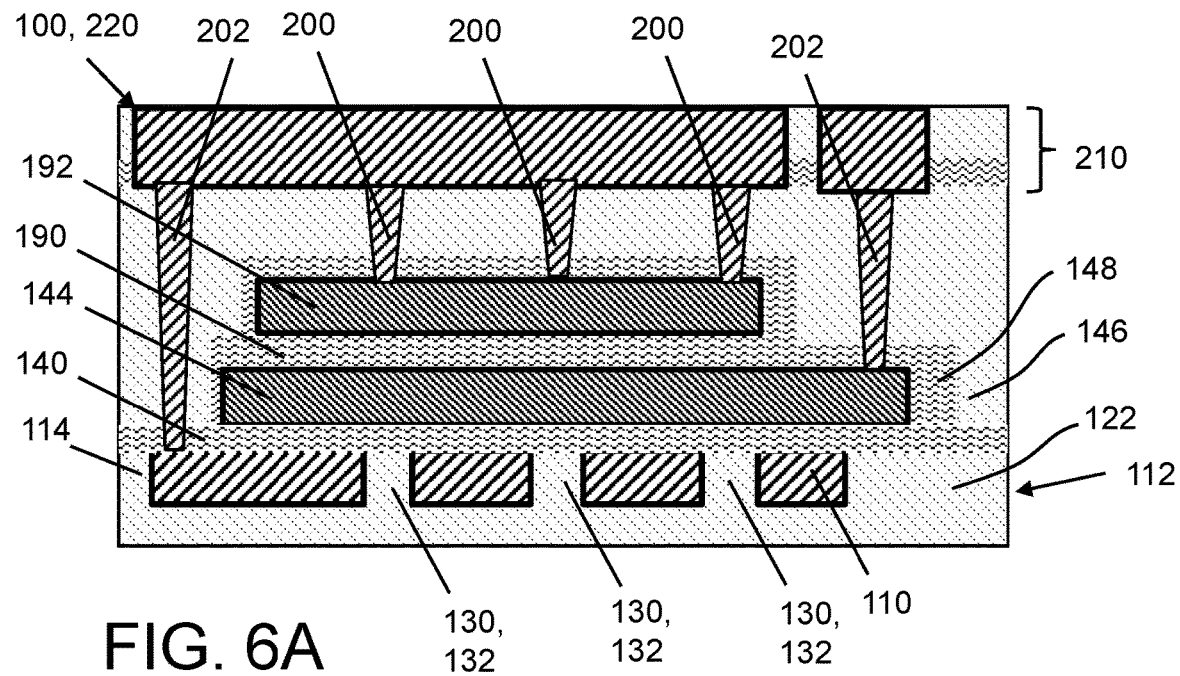
FIG. 6A shows a cross-sectional view of forming at least one via to the third metal electrode and a structure based on the FIG. 5 embodiments of the disclosure.

FIG. 6A shows a cross-sectional view of forming at least one via 200 on (third) metal electrode 192. As illustrated, each via 200 on metal electrode 192 is in a location over a respective dielectric region 130, i.e., dielectric pillar 132, in first metal (copper) electrode 110. At least one via 202 to first metal electrode 110 may also be formed. At least one via 204 to second metal electrode 140 may also be formed. Because the area at the level of first metal electrode 110 under which via 204 lands on second metal electrode 144 includes part of layer 122 that laterally surrounds first metal electrode 110, dielectric region 130 is not in first metal electrode 110 for via(s) 104. Vias 200, 202, 204 may be formed using any now known or later developed technique as described herein relative to vias 160, 162 in FIGS. 4A-B. As with FIGS. 4A-B, formation of dielectric region(s) 130, e.g., dielectric pillar(s) 132, in first metal electrode 110 removes any area that could cause defects that could affect formation or operation of via(s) 200. For example, dielectric region(s) 130 remove any hillocks on a metal (copper) electrode 110 that could narrow first dielectric layer 140, metal electrode 144, second dielectric layer 190 or metal electrode 192, or otherwise cause break-through of via(s) 200 through at least metal electrode 192.

Any number of conventional interconnect layers 210 may be subsequently formed over vias 200, 202. For example, a metal wire interconnect layer 210 may be formed to interconnect selective vias 200, 202. It will be recognized that a wide variety of additional layers can be created.

FIG. 6A also shows structure 100 according to other embodiments of the disclosure. In these embodiments, structure 100 may take the form of a triple MIM capacitor structure 220. Structure 100 includes the same structure as described herein relative to FIG. 4. In addition thereto, structure 100 in FIG. 6A also includes second dielectric layer 190 on (second) metal electrode 144 and (third) metal electrode 192 on second dielectric layer 190. As noted, first metal electrode 110 may include, for example, copper (Cu). In certain embodiments, metal electrode 144 and metal electrode 192 may include tantalum. In other embodiments, metal electrode 144 and/or metal electrode 192 may include any metal appropriate for a non-bottom electrode of a MIM capacitor such as but not limited to tungsten, titanium, ruthenium, cobalt, copper or aluminum. Second dielectric layer 190 may include any of the same materials listed herein for first dielectric layer 140 and may be formed in the same manner.

Figure 6B:
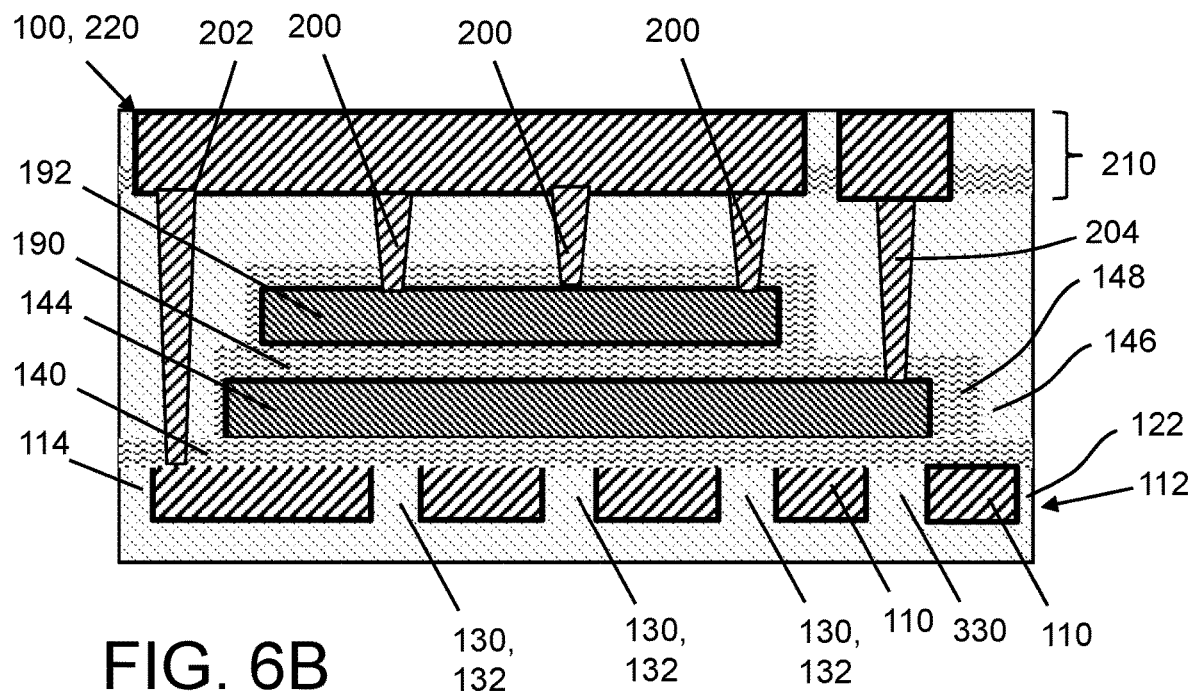
FIG. 6B shows a cross-sectional view of a structure similar to FIG. 6A, according to an alternative embodiment of the disclosure.

FIG. 6B shows a cross-sectional view of structure 100, similar to FIG. 6A, but according to an alternative embodiment of the disclosure. Structure 100 in FIG. 6B is substantially similar to that in FIG. 6A. However, in this embodiment, first metal electrode 110 includes another dielectric region 330 therein under which via 204 lands on second metal electrode 144. Dielectric region 330 provides the same function for via 204 relative second metal electrode 144 as other dielectric regions 130 described herein. For example, dielectric region(s) 330 remove any hillocks on a metal (copper) electrode 110 that could narrow first dielectric layer 140 or metal electrode 144, or otherwise cause break-through of via(s) 204 through at least metal electrode 144.

Figure 7:
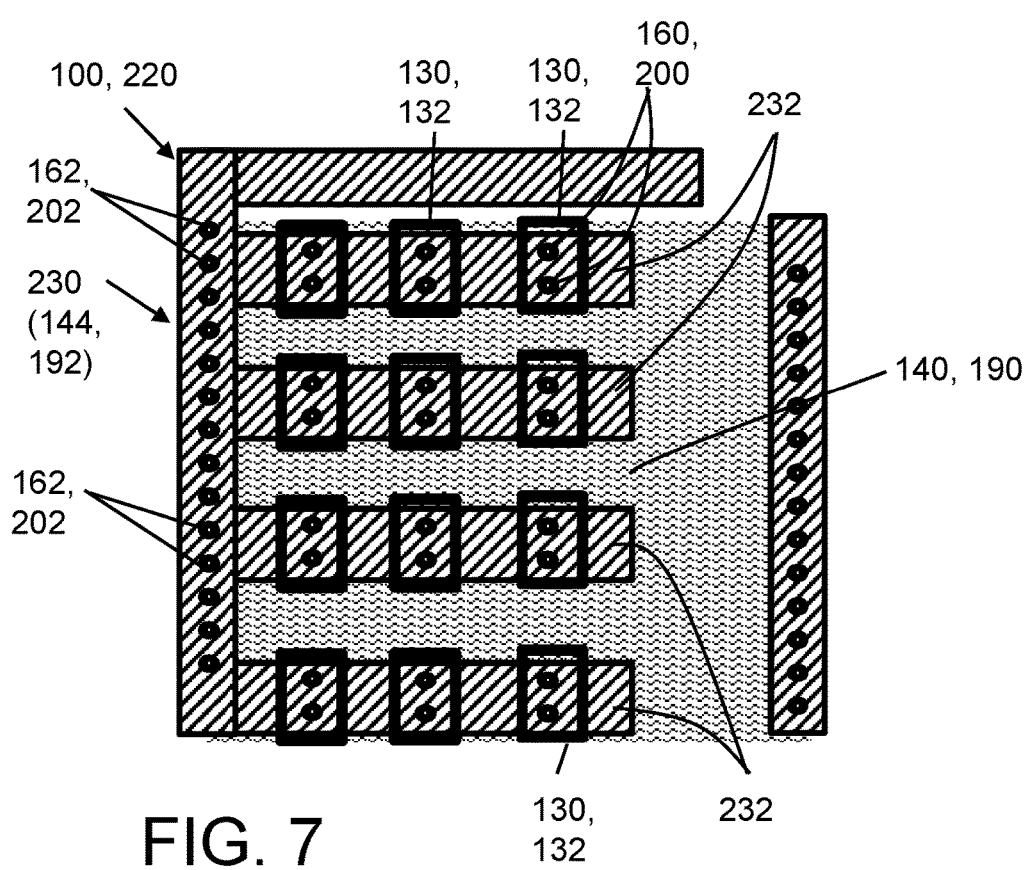
FIG. 7 shows a top-down schematic view of vias on a digitated upper metal electrode and over dielectric regions, according to embodiments of the disclosure.

FIG. 7 shows a top-down view of a structure 100 according to other embodiments of the disclosure. Dielectric region(s) 130, such as dielectric pillar(s) 132, are shown in a see-through manner in FIG. 7 with thick lined boxes. Electrodes 110, 144, 192 described herein can have any horizontal layout. In the example shown, an uppermost metal electrode 230, which can be second electrode 144 in FIGS. 4A-B or third metal electrode 192 in FIGS. 6A-B, has a plurality of digitated elements 232 over first dielectric layer 140 (or second dielectric layer 190). At least one via 160 (FIGS. 4A-B) or 200 (FIGS. 6A-B) lands on at least one of the plurality of digitated elements 232. In any event, dielectric regions 130, e.g., dielectric pillars 132, have a horizontal cross-sectional size sufficient to be under at least one via 160, 200. In other embodiments, as shown in FIG.

7, dielectric regions 130 have a horizontal cross-sectional size sufficient to be under more than one of the at least one vias 160, 200. Two vias are shown on each region 130 in FIG. 7, but more could be provided over each region 130.

Dielectric region(s) 130 can have any horizontal cross-sectional shape to accommodate any number, shape or size of via 160, 200 thereover, and to prevent break-through thereof into layers below. FIGS. 8-10 show top-down, schematic views of a few examples. In FIG. 8, two contacts 160, 200 are over a polygonal (e.g., rectangular) dielectric region 130. In FIG. 9, one via 160, 200 is over a dielectric region 130 have a similar shape but larger size than the via 160, 200, e.g., circular or oblong. In FIG. 10, one via 160, 200 is over a similarly shaped but larger sized dielectric region 130, e.g., both polygonal such as rectangular. In any event, at least one of plurality of dielectric regions 130, e.g., dielectric pillars 132, has a horizontal cross-sectional size sufficient to be under more than one of the at least one vias 160, 200, e.g., any slotting or cheesing formation.

Figure 12:
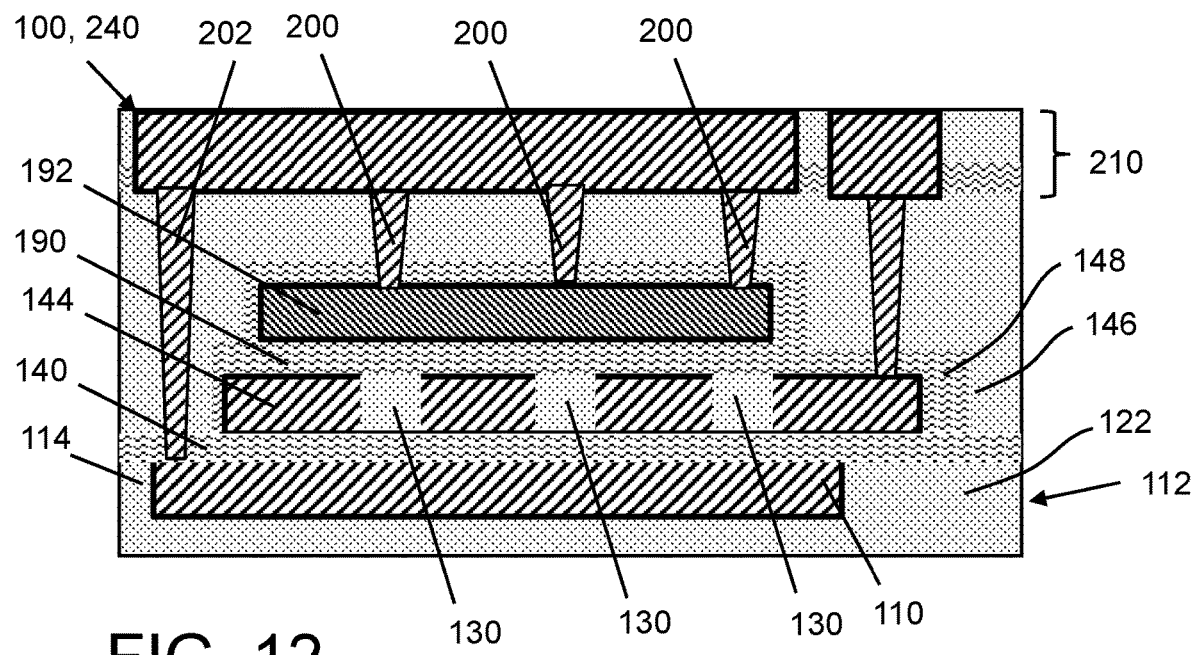
FIG. 12 shows a cross-sectional view of a structure, according to alternative embodiments of the disclosure.

While the teachings of the disclosure have been applied to a lower metal electrode 110, it will be recognized that dielectric region(s) 130 such as dielectric pillar(s) 132 can also be applied to a middle electrode 144, e.g., where it includes copper or other metal prone to defects and via break-through of another electrode thereover is a concern. FIG. 11 shows a cross-sectional view of an embodiment of a triple MIM capacitor structure 240 in which both lower metal electrode 110 and middle electrode 144 include dielectric region(s) 130. FIG. 12 shows a cross-sectional view of an embodiment of a triple MIM capacitor structure 240 in which just middle electrode 144 includes dielectric region(s) 130.

Embodiments of the disclosure provide various technical and commercial advantages, examples of which are discussed herein. The structure prevents nano-scale defects in the first metal electrode, such as copper hillocks or similar defects, from negatively impacting layers thereover in a manner that can result in defects such as via punch-through or break-through of metal electrode(s) and dielectric layers over the first metal electrode. The structure can be applied to a capacitor regardless of the number of metal electrodes therein. The structure results in less defects and better performance, e.g., breakdown voltage, for capacitor structures.

The structure and method as described herein are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
   a first metal electrode;
   at least one dielectric region in the first metal electrode;
   a first dielectric layer on the first metal electrode;
   a second metal electrode on the first dielectric layer, wherein the second metal electrode includes a plurality of digitated elements over the first dielectric layer;
   at least one via on the second metal electrode, each of the at least one via is over the at least one dielectric region in the first metal electrode;
   a second dielectric layer on the second metal electrode; and
   a third metal electrode on the second dielectric layer and extending horizontally over at least two of the plurality of digitated elements of the second metal electrode.

2. The structure of claim 1, wherein the first metal electrode includes copper (Cu).

3. The structure of claim 1, wherein the at least one dielectric region includes an oxide.

4. The structure of claim 1, wherein the at least one via is vertically aligned over the at least one dielectric region in the first metal electrode.

5. The structure of claim 1, wherein the first metal electrode includes copper (Cu), and the second metal electrode and the third metal electrode include tantalum (Ta).

6. The structure of claim 1, wherein the first dielectric layer and the second dielectric layer include a nitride.

7. The structure of claim 1, wherein the at least one dielectric region has a horizontal cross-sectional size sufficient to be under more than one of the at least one via.

8. The structure of claim 1, wherein the first metal electrode is positioned in a last metal layer of a device.

9. The structure of claim 1, further comprising a plurality of additional vias on the third metal electrode, wherein each of the plurality of additional vias is vertically aligned with a gap between the plurality of digitated elements of the second metal electrode.

10. A capacitor structure, comprising:
   a copper electrode;
   at least one oxide region in the copper electrode;
   a first dielectric layer on the copper electrode;
   a first metal electrode on the first dielectric layer;
   a second metal electrode on the first dielectric layer, wherein the second metal electrode includes a plurality of digitated elements over the first dielectric layer;
   at least one via on the first metal electrode, wherein the at least one via is over the at least one oxide region in the copper electrode;
   a second dielectric layer on the second metal electrode; and
   a third metal electrode on the second dielectric layer and extending horizontally over at least two of the plurality of digitated elements of the second metal electrode.

11. The capacitor structure of claim 10, wherein the at least one via is vertically aligned over the at least one oxide region in the copper electrode.

12. The capacitor structure of claim 10, wherein the first metal electrode and the second metal electrode include tantalum (Ta).

13. The capacitor structure of claim 10, wherein the at least one oxide region has a horizontal cross-sectional size sufficient to be under more than one of the at least one via.

14. The capacitor structure of claim 10, wherein the copper electrode is positioned in a last metal layer of a device.

15. The structure of claim 10, further comprising a plurality of additional vias on the third metal electrode, wherein each of the plurality of additional vias is vertically aligned with a gap between the plurality of digitated elements of the second metal electrode.

16. A method comprising:
   forming a copper electrode over a substrate, the copper electrode having at least one oxide region interspersed therewithin;
   forming a first dielectric layer on the copper electrode;
   forming a first metal electrode on the first dielectric layer;
   forming a second metal electrode on the first dielectric layer, wherein the second metal electrode includes a plurality of digitated elements over the first dielectric layer;
   forming at least one via on the first metal electrode, wherein the at least one via in a location is over the least one oxide region in the copper electrode;
   forming a second dielectric layer on the second metal electrode; and
   forming a third metal electrode on the second dielectric layer and extending horizontally over at least two of the plurality of digitated elements of the second metal electrode.

17. The method of claim 16, wherein forming the copper electrode includes:
   forming an opening in a dielectric layer, the opening including the at least one oxide region therein;
   forming copper in the opening and about the at least one oxide region; and
   planarizing to form the copper electrode.

18. The method of claim 16, wherein the at least one oxide region has a horizontal cross-sectional size sufficient to be under more than one of the at least one vias.

19. The method of claim 16, wherein the first metal electrode and the second metal electrode include tantalum (Ta).

* * * * *